US008844612B2

(12) United States Patent
Tani et al.

(10) Patent No.: US 8,844,612 B2
(45) Date of Patent: Sep. 30, 2014

(54) THERMAL CONTROLLER FOR ELECTRONIC DEVICES

(75) Inventors: Tony Mitsuaki Tani, Poway, CA (US); Larry Ray Stuckey, San Diego, CA (US)

(73) Assignee: Advantest Corporation, Tokyo (JP)

( * ) Notice: Subject to any disclaimer, the term of this patent is extended or adjusted under 35 U.S.C. 154(b) by 1076 days.

(21) Appl. No.: 12/445,669

(22) PCT Filed: Oct. 29, 2008

(86) PCT No.: PCT/US2008/081515
§ 371 (c)(1),
(2), (4) Date: Jun. 29, 2009

(87) PCT Pub. No.: WO2010/050933
PCT Pub. Date: May 6, 2010

(65) Prior Publication Data
US 2010/0175866 A1  Jul. 15, 2010

(51) Int. Cl.
*G05D 23/00*  (2006.01)
*G01R 31/28*  (2006.01)

(52) U.S. Cl.
CPC .................................. *G01R 31/2874* (2013.01)
USPC ............ 165/294; 165/103; 165/288; 165/266

(58) Field of Classification Search
USPC ........... 165/287, 288, 289, 299, 300, 96, 103; 374/45, 50
See application file for complete search history.

(56) References Cited

U.S. PATENT DOCUMENTS 5,977,785 A * 11/1999 Burward-Hoy .......... 324/750.09
6,415,858 B1    7/2002 Getchel et al.
6,886,976 B2 *  5/2005 Gaasch et al. ..................... 374/5
7,100,389 B1 *  9/2006 Wayburn et al. ............. 62/259.2
7,114,556 B2   10/2006 Hamilton et al.
7,307,438 B2 * 12/2007 Ono et al. ................. 324/750.09

(Continued)

FOREIGN PATENT DOCUMENTS

WO  2009/017495  2/2009
WO  2009/035459  3/2009

OTHER PUBLICATIONS

U.S. Appl. No. 12/278,841 to Stuckey et al., filed Aug. 8, 2008.
U.S. Appl. No. 12/278,843 to Stuckey, filed Aug. 8, 2008.
Written Opinion of the International Searching Authority—WIPO, dated May 12, 2011 (International Application. No. PCT/US2008/081515).

(Continued)

*Primary Examiner* — Marc Norman
*Assistant Examiner* — Devon Russell
(74) *Attorney, Agent, or Firm* — Greenblum & Bernstein, P.L.C.

(57) ABSTRACT

An apparatus is provided for controlling a temperature of a device by circulating fluid through a heat sink in thermal contact with the device. The apparatus includes a first fluid source (505) including a first fluid having a first temperature, a second fluid source (510) including a second fluid having a second temperature, and a thermal chuck (500) operably connected to the first fluid source and the second fluid source, wherein the thermal chuck is configured to receive the first fluid and the second fluid to be circulated through the heat sink (555). A method is also provided for controlling a temperature of a device in contact with a heat sink. The method includes determining a target temperature (S602), initiating a flow of a fluid from a fluid source (S604, S702), determining temperature data (S606, S704) of the device and the heat sink, and variably adjusting a flow rate (S710, S712) of the fluid to generally maintain the device at the target temperature.

3 Claims, 11 Drawing Sheets

(56) References Cited

U.S. PATENT DOCUMENTS

| | | |
|---|---|---|
| 7,355,428 B2 * | 4/2008 | Kabbani et al. .......... 324/750.08 |
| 8,025,097 B2 * | 9/2011 | Di Stefano et al. ............ 165/276 |
| 8,151,872 B2 * | 4/2012 | Di Stefano .................... 165/253 |
| 2005/0151553 A1 * | 7/2005 | Kabbani et al. ............... 324/760 |
| 2008/0223555 A1 * | 9/2008 | Di Stefano .................... 165/101 |

OTHER PUBLICATIONS

German Office action, dated May 24, 2013 along with an english translation thereof.

* cited by examiner

THERMAL CONTROLLER FOR ELECTRONIC DEVICES

BACKGROUND

1. Field of the Disclosure

The present disclosure relates to the field of temperature control, and more particularly, to maintaining a set point temperature of an electronic device through heating and/or cooling of the electronic device or component, typically while the electronic device or component is under test.

2. Background Information

Solid state electronic devices or components, such as semiconductors, have varying performance characteristics based on temperature. Typically, for example, such electronic devices generate heat (i.e., self-heat) during operation, and thus as the internal temperature increases, the performance characteristics change. Also, solid state electronic devices may be used in different environments, possibly enduring a wide range of temperatures.

To ensure constant performance characteristics, it is desirable to maintain a relatively constant temperature of electronic devices. This is especially true when functionally testing electronic devices to ensure proper operation and compliance with design specifications. For example, an electronic device, referred to as a device under test (DUT), may undergo endurance procedures, such as short-circuit testing and burn-in testing, to observe various device characteristics. During such testing, the temperature of the DUT must be kept relatively constant at a predetermined test temperature, or set point temperature, in order for the results to be meaningful. In other words, the tester must be able to confirm that certain observed electrical characteristics are attributable to factors other than changing temperatures.

In order to maintain a constant temperature, known thermal control devices are capable of removing heat, e.g., through a heat sink, as well as adding heat, e.g., through an electric heater. A heat sink incorporates a fluid having a temperature much lower than the test temperature of the DUT. A heater is placed between the DUT and the heat sink, and power is applied to the heater to raise the temperature of the heater face, e.g., to the test temperature required for DUT testing. The heat sink offsets any excess heating, and also removes heat generated by the DUT during the testing process, to the extent this self-heating increases the device temperature beyond the test temperature. Power fluctuations may cause significant and relatively instantaneous self-heating, requiring the need for the thermal controller to quickly and accurately react to offset the unwanted increase in temperature.

However, the total amount of power that can be removed is limited by the heater itself, which has a maximum for power density (or Watt Density). For example, if a heater is capable of operating at 500 Watts, then approximately half of that power may be lost through the heat sink into the colder fluid simply to maintain the test temperature. Thus, for example, 250 Watts are required to maintain test temperature. Then, if power in the heater is reduced to zero in response to power being applied to the DUT, the maximum amount of power which can be removed from the DUT is 250 Watts. Otherwise, the heater will be unable to offset heat removed through the heat sink. This is particularly problematic in that current requirements of DUT testing have risen to 500 Watts total power and are projected to be higher in the future. Additionally, the heater also adds unwanted thermal resistance, adds thermal mass, induces gradients (non-thermally uniform surface) and renders an inadequate response time.

Improvements to this type of thermal controller are difficult to implement. For example, the heat sink must be appropriately balanced to the heater, which may be a disincentive for improving heat sink efficiency. That is, if the heat sink's heat removal capability is improved, e.g., by increasing fluid flow through the heat sink, reducing the fluid temperature, improving fin efficiency and/or incorporating a more effective fluid, the heater capacity would likewise need to be increased to offset the improvements in cooling capabilities and maintain the testing temperature.

Other thermal controllers are not necessarily dependent on the combination of heat sinks and heaters, but they still have functional inefficiencies. For example, Peltier devices create heat differentials from electric voltages, effectively acting as both a heat sink and a heat source. A drawback of Peltier devices, though, is that they are unable to remove significant power or to handle high power densities because the response time required to dynamically react to and remove power from an electronic device is inadequate.

Further, thermal controllers that mix fluids having different temperatures to maintain the set point temperature, or a target temperature, of the DUT during a testing of the DUT have drawbacks as well. When two fluids at different temperatures are combined, a thermal controller system, including e.g., a chiller(s) and/or a heater(s), has to recover the energy lost from the mixing of the fluids at two different temperatures and must compensate for the lost energy by re-cooling/re-heating the fluids before the fluids are recirculated through the thermal controller system during testing of the DUT. One such device is disclosed in International Application Number PCT/US07/74727, the disclosure of which is expressly incorporated herein by reference in its entirety. To recover the energy lost, the thermal controller system must work hard to separate, re-cool and re-heat the previously mixed fluid to achieve each fluid's original temperature before being combined.

Therefore, a need exists for a simplified thermal controller system that meets the demands of maintaining a target temperature of an electronic device under test, that minimizes energy loss, and that maximizes cyclical efficiency (i.e., does not require the system to work harder to recover the lost energy). There is also a need for a thermal controller system that reduces costs and minimizes required equipment.

SUMMARY OF THE INVENTION

Accordingly, the present invention has been made to overcome the conventional drawbacks of existing thermal controller systems. In one non-limiting example, the present invention provides an apparatus for controlling a temperature of a device by circulating fluid through a heat sink in thermal contact with the device. The apparatus includes a first fluid source including a first fluid having a first temperature, a second fluid source including a second fluid having a second temperature different from the first temperature, and a thermal chuck operably connected to the first fluid source via a first supply conduit. The thermal chuck is further operably connected to the second fluid source via a second supply conduit. The thermal chuck includes at least one valve configured such that the flow rate of the first fluid circulating through the heat sink is generally constant. The at least one valve is further configured to variably control a flow rate of the second fluid circulating through the heat sink. The thermal chuck may be configured to output the first fluid and the second fluid to be recirculated through the apparatus.

According to a second feature of the invention, the apparatus may include a plurality of return conduits, wherein the plurality of return conduits connect the thermal chuck to the first fluid source and the second fluid source. When the first fluid source is operable, the second fluid source is shut-off, and the first fluid flows through the first supply conduit through the at least one valve to the heat sink before a testing of the device. When the second fluid source is operable, the first fluid source is shut-off, and the second fluid flows through the second supply conduit through the at least one valve to the heat sink during a testing of the device.

According to another feature of the present invention, the device temperature is generally maintained at the first temperature, and the first fluid circulates through the apparatus before the testing of the device to generally achieve a target temperature of the device. Alternatively, the second fluid circulates through the apparatus and generally maintains a target temperature of the device during the testing of the device.

According to another feature of the present invention, the thermal chuck is configured such that the first fluid circulates through the heat sink before the second fluid. [0014] In yet another feature of the non-limiting embodiment, the flow rate of the second fluid directly affects a temperature of the heat sink. The flow rate of the second fluid also changes in accordance with a change in the temperature of the device and/or a change in the temperature of the heat sink. That is, the flow rate of the second fluid adjustably compensates for changes in the temperature of the heat sink based upon changes in the temperature of the device. The flow rate of the second fluid increases when temperature of the device increases, and the flow rate of the second fluid decreases when temperature of the device decreases. The flow rate of the second fluid increases when temperature of the heat sink increases, and wherein the flow rate of the second fluid decreases when temperature of the heat sink decreases.

According to another feature of the present invention the target temperature of the device may be the first temperature and the second temperature may be lower than the first temperature.

In a second non-limiting embodiment, the apparatus further includes a third fluid source including a third fluid having a third temperature different from the first and second temperatures, wherein the thermal chuck is operably connected to the third fluid source via a third supply conduit, and the at least one valve is further configured to variably control a flow rate of the third fluid circulating through the heat sink.

According to a feature of the second embodiment, the first supply conduit includes a bypass conduit connecting the third fluid source to the first fluid source. In this regard the first fluid from the first fluid source is directed through the bypass conduit via the first supply conduit to the third fluid source. When the first fluid flows through the bypass conduit to the third fluid source, the third fluid source is operable. When the third fluid source is operable, the first fluid source and the second fluid source are shut-off, and the third fluid is heated to a peak temperature as it flows through the third supply conduit through the at least one valve to the heat sink before a testing of the device. In one option, when the third fluid having the third temperature reaches the peak temperature, the third fluid source is shut-off, the first fluid source is operable and the first fluid flows through the first supply conduit through the at least one valve to the heat sink to generally maintain a target temperature of the device before the testing of the device. In a second option, when the third fluid having the third temperature reaches the peak temperature, the at least one valve adjusts the flow rate of the third fluid to generally maintain a target temperature of the device before the testing of the device. A third option is also provided for where the second fluid source is utilized to generally maintain the target temperature of the device before testing.

According to another feature of the second non-limiting embodiment, the first temperature is a target temperature of the device and the second temperature is lower than the first temperature.

According to a farther feature of the second non-limiting embodiment, when the second fluid source is operable, the first fluid source and the third fluid source are shut-off, and wherein the second fluid flows through the second supply conduit through the at least one valve to the heat sink during a testing of the device.

According to a still further feature, the third fluid circulates through the apparatus before the testing of the device, and wherein the device temperature is generally maintained at a target temperature.

In yet another feature, the thermal chuck is configured such that the third fluid circulates through the heat sink before the second fluid. The flow rate of the third fluid directly affects a temperature of the heat sink.

According to a feature of the second non-limiting embodiment, the flow rate of the third fluid is generally constant when the third temperature is less than the peak temperature, and wherein the flow rate of the third fluid decreases when the third temperature is greater than the peak temperature.

According to another feature of the second non-limiting embodiment, the target temperature of the device is the first temperature, and the third temperature is higher than the first temperature and the second temperature.

In an additional non-limiting embodiment, the present invention provides for a method for controlling a temperature of a device in thermal contact with a heat sink. The method includes determining at least a first temperature of a first fluid, and a second temperature of a second fluid, initiating, at a generally constant rate, a flow of a first fluid source having the first fluid, determining temperature data of at least one of the device and the heat sink, initiating a flow of a second fluid source having the second fluid; and variably adjusting a flow rate of the second fluid to generally maintain the device at a target temperature. The method may further include shutting off the flow of the second fluid from the second fluid source, initiating the flow of the first fluid from the first fluid source, comparing the temperature data to the target temperature, and discharging the first fluid through the heat sink at the generally constant flow rate.

According to a second feature of the invention, the method may include detecting the device at the target temperature, shutting off the flow of the first fluid from the first fluid source, initiating the flow of the second fluid from the second fluid source, determining the temperature data of the device and the heat sink, comparing the temperature data to the target temperature of the device, discharging the second fluid at a flow rate corresponding to a difference between the temperature data and the target temperature; and variably adjusting the flow rate to generally maintain the target temperature of the device.

According to another feature of the invention, the method may include circulating the first fluid through the heat sink; and generally maintaining the temperature of the device at the first temperature. Alternatively, the method may include circulating the second fluid through the heat sink, and generally maintaining the temperature of the device at the target temperature.

According to yet another feature, the target temperature of the device is the first temperature.

According to still another feature, the method may include increasing the flow rate of the second fluid when the temperature data is greater than the target temperature, and decreasing the flow rate of the second fluid when the temperature data is less than the target temperature.

According to a further feature, the method may include determining the temperature of the device, a temperature of the heat sink, a power density of the device, and a resistivity of the heat sink.

According to another feature, the method may include that when the flow rate of the second fluid is variably adjusted, the adjustment is such that when the temperature of the device increases, the flow rate of the second fluid increases, and when the temperature of the device decreases, the flow rate of the second fluid decreases. More specifically, the adjustment of the flow rate is such that when the power density of the device increases, the flow rate of the second fluid increases, and when the power density of the device decreases, the flow rate of the second fluid decreases. The flow rate may also adjust such that when the temperature of the heat sink increases, the flow rate of the second fluid increases, and when the temperature of the heat sink decreases, the flow rate of the second fluid decreases. In this regard, as the flow rate of the second fluid increases, the resistivity of the heat sink decreases, and as the flow rate of the second fluid decreases, the resistivity of the heat sink increases.

According to still another feature, the second temperature is lower than the first temperature, and the first fluid and the second fluid do not mix.

According to another non-limiting embodiment of the invention, the method may include shutting off the flow of the second fluid from the second fluid source, initiating the flow of the first fluid from the first fluid source, directing the first fluid to a third fluid source, heating the first fluid into a third fluid, determining a third temperature of the third fluid, comparing the temperature data to the target temperature, and circulating the third fluid through the heat sink at a flow rate. The method may further include shutting off the flow of the first fluid from the first fluid source.

According to a feature of this embodiment, the method may include comparing the third temperature of the third fluid to a peak temperature, detecting the third fluid at the peak temperature, shutting off the flow of the third fluid from the third fluid source; and initiating the flow of the first fluid having the first temperature from the first fluid source to generally maintain the temperature of the device at the target temperature.

According to another feature of this embodiment, the method may include comparing the third temperature of the third fluid to a peak temperature, detecting the third fluid at the peak temperature, and variably adjusting the flow rate of the third fluid to generally maintain the temperature of the device at the target temperature.

According to yet another feature of this embodiment, the method may include shutting off the flow of the first fluid from the first fluid source, detecting the device at the target temperature, initiating the flow of the second fluid from the second fluid source, determining the temperature data of the device and the heat sink, comparing the temperature data to the target temperature of the device, discharging the second fluid at a flow rate corresponding to a difference between the temperature data and the target temperature, and variably adjusting the flow rate of the second fluid to generally maintain the target temperature of the device.

In still another feature of this embodiment, the method may include shutting off the flow of the third fluid from the third fluid source, detecting the device at the target temperature, initiating the flow of the second fluid from the second fluid source, determining the temperature data of the device and the heat sink, comparing the temperature data to the target temperature of the device, discharging the second fluid at a flow rate corresponding to a difference between the temperature data and the target temperature, and variably adjusting the flow rate of the second fluid to generally maintain the target temperature of the device. Determining the temperature data further includes determining the temperature of the device, a temperature of the heat sink, a power density of the device, and a resistivity of the heat sink.

According to a feature of this embodiment, the target temperature of the device is the first temperature.

According to another feature of this embodiment, the method may include decreasing the flow rate of the third fluid when the temperature data is greater than the target temperature, and increasing the flow rate of the third fluid when the temperature data is less than the target temperature.

According to a further feature of this embodiment, as the flow rate of the third fluid increases, the resistivity of the heat sink increases, and as the flow rate of the third fluid decreases, the resistivity of the heat sink decreases.

According to yet another feature of this embodiment, the third fluid having the third temperature is a hot fluid having a hot temperature that is higher than the first temperature of the first fluid and the second temperature of the second fluid.

BRIEF DESCRIPTION OF THE DRAWINGS

The present disclosure provides a detailed description that follows by reference to the noted drawings by way of non-limiting examples, in which like reference numerals represent similar parts throughout several views of the drawings, and in which.

DETAILED DESCRIPTION

The present disclosure relates to an apparatus and method for regulating the temperature of an electronic device, such as a solid state electronic device being tested in a controlled environment, referred to as a device under test (DUT). In an embodiment portions of a fluid (which may be any non-solid material, including but not limited to a liquid, a gas, particulates, granules or any combination thereof), having the same respective temperatures can be sent through a heat sink, where a flow rate of the fluid is adjusted to maintain and control a target temperature of the DUT. As defined herein, "heat sink" means any heat transfer element or device (e.g., resistive heater, radiator, heat pipe, cross-flow heat exchanger, etc. . . . ) structured and arranged to transfer heat to and/or from an object which it is in thermal contact with.

Figure 1:
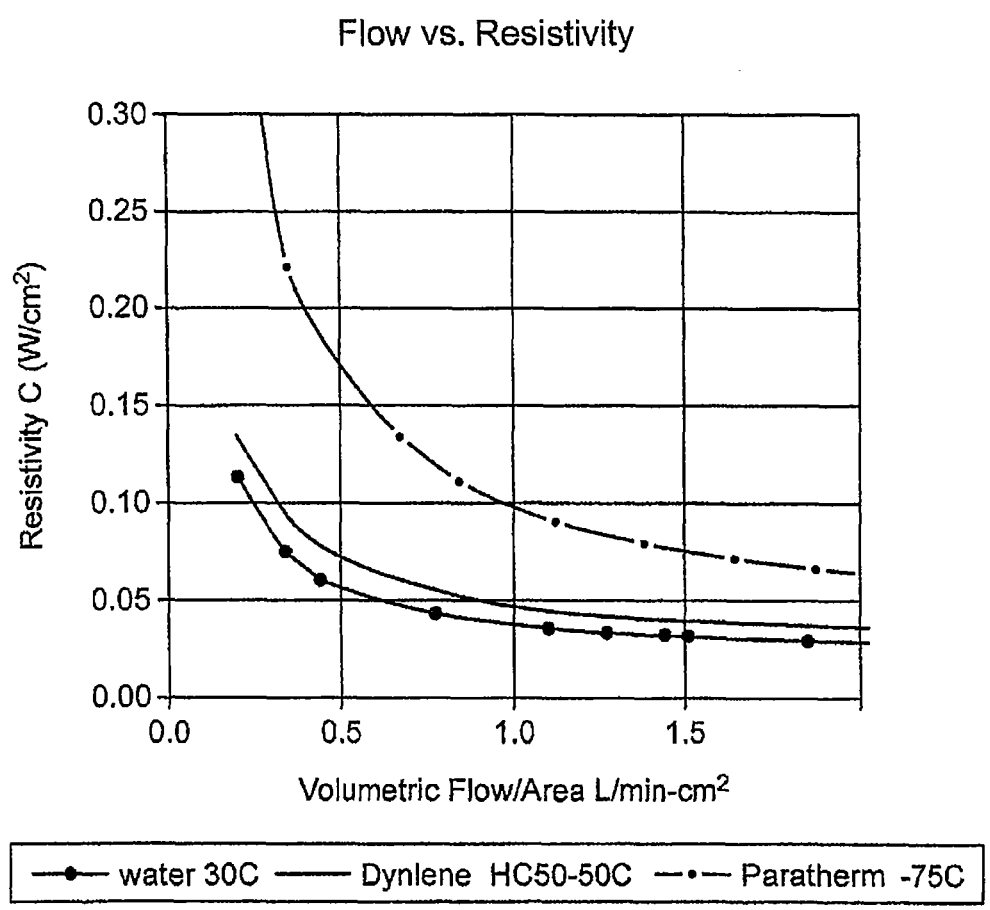
FIG. 1 shows a graph depicting the relationship between fluid flow flowing over a heat transfer element and resistivity of the heat transfer element.

As shown in FIG. 1 there is a well-defined relationship between flow rate of a fluid passing through a heat sink and resistivity of the heat sink (i.e., the heat sink's resistance to thermal heat transfer). As the flow rate of fluid increases through the heat sink, the resistivity of the heat sink decreases. In other words, in a thermal controller system, when the heat sink has decreased resistivity, the heat sink is capable of dissipating additional power generated from the DUT to maintain and control a target temperature of the DUT during testing. Thus, DUT power can be dissipated and controlled at a target temperature by adjusting the flow rate of fluid passing through the heat sink.

Figure 2:
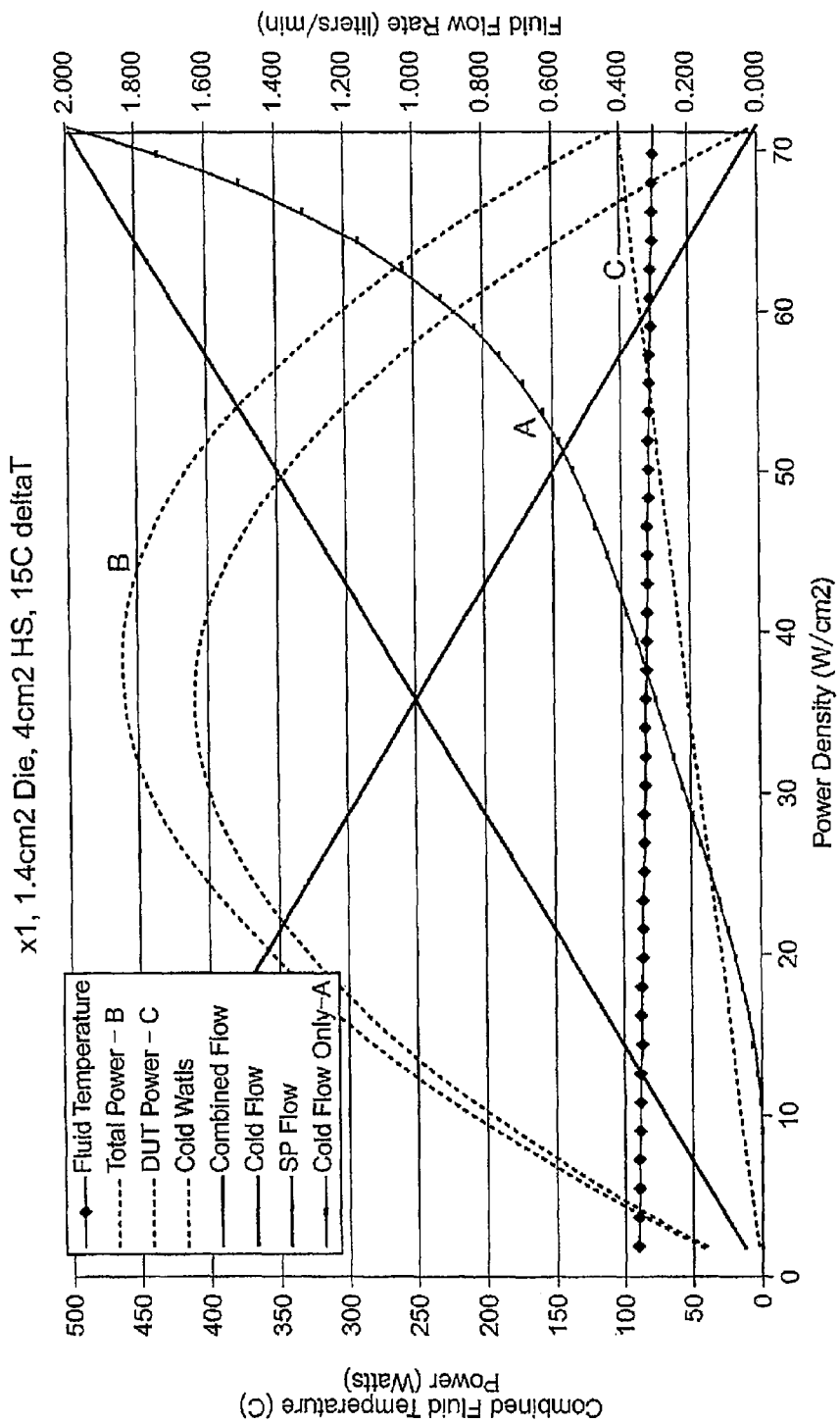
FIG. 2 shows a graph comparing power requirements of thermal controller systems utilizing either a combined fluid flow or a cold fluid flow only to dissipate heat from each system, respectively.

FIG. 2 illustrates a comparison between power requirements of a thermal controller system using fluid at a single temperature and fluids of different temperatures being mixed for use in the system. More particularly, FIG. 2 depicts a Cold Flow Only Curve plotting power density of a DUT versus fluid flow rate of a fluid in the system (see curve A). As shown, as the power density (i.e., heat per unit of area) of the device increases during testing, the flow rate increases to offset/dissipate the heat increase of the device. FIG. 2 also depicts a Total Power Curve, i.e., a curve showing power requirements of a system utilizing at least two different fluids at two different temperatures for a given power density of the DUT (see curve B). The Total Power Curve assumes that the fluid flow rate is constant at 2 L/min. Thus, for any known power density value of a DUT, the power requirement of the system using mixed/combined fluid at different temperatures can be determined. FIG. 2 further depicts a DUT Power Curve (see curve C), i.e., a curve representing power requirements of a system utilizing fluid having a single temperature. In other words, the fluid used during testing is maintained at a predetermined temperature before being circulated through the system. The DUT Power Curve (C) mirrors the Cold Flow Only Curve (A). Thus, as the power of the device increases and the power density increases so does the fluid flow rate to dissipate the power density of the DUT. Thus, introduction of fluid at a single temperature during testing of an electronic device reduces the power consumption of the thermal controller system and ultimately increases the efficiency of the thermal controller device compared to thermal controller systems utilizing mixed fluids of variable temperatures.

Figure 3:
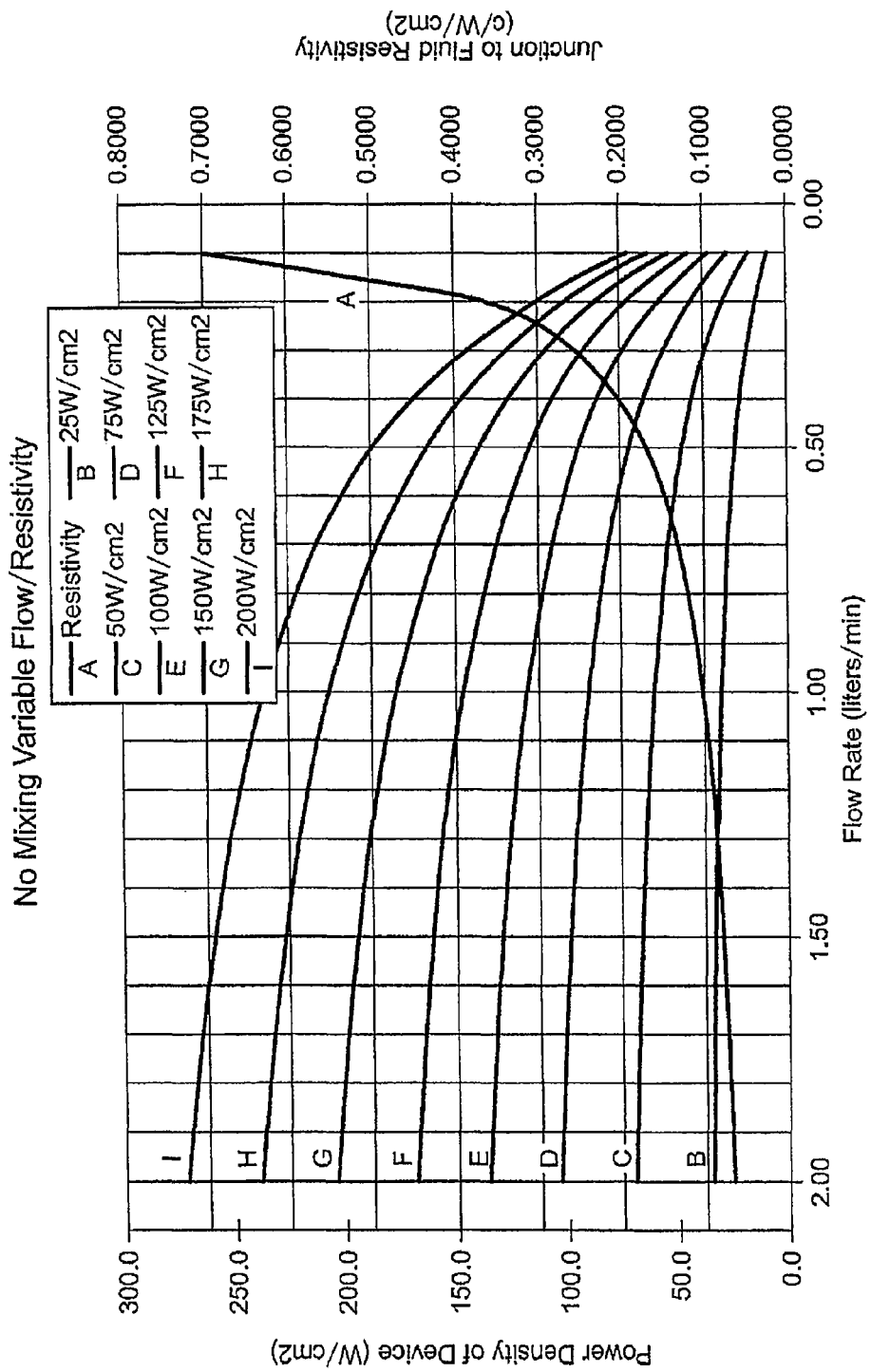
FIG. 3 shows a graph depicting the relationship between fluid flow flowing over a heat transfer element and resistivity of the heat transfer element, as well as representative power density (heat dissipation) curves.

Similar to FIG. 1, FIG. 3 illustrates a relationship between fluid flow rate and resistivity of a heat sink, as well as representative power density curves. As shown, the resistivity of the heat sink decreases as the flow rate increase (see curve A). It is known that the power density of a DUT is proportional to a change in temperature and inversely proportional to the resistivity of the heat sink. An equation for determining power density is:

$$PD = \Delta T/R$$

wherein,
PD=power density
ΔT=a change in temperature of the fluid temperature from the set point temperature of the DUT
R=resistivity of the heat sink That is, power density can be determined by a change in temperature of the fluid temperature from the set point temperature of the DUT divided by the resistivity of the heat sink. In this regard, the power density curves illustrate that as the resistivity of the heat sink increases, the required temperature to dissipate the heat generated by the DUT during testing must also increase. Thus, to determine the change in temperature required for the system to dissipate heat from the DUT to maintain the DUT at a target temperature, the power density of the DUT is multiplied by the resistivity of the heat sink for a given flow rate. Thus, as flow rate of the fluid is increased, resistivity of the DUT is decreased and as a result, the required temperature difference between the set point temperature before testing and fluid temperature circulating through the system during testing is lower.

Therefore, a system can dissipate more power from a DUT with an increased flow rate or a larger change in temperature between set point temperature of the DUT before testing and fluid temperature during testing. In other words, if flow rate is increased, the difference in temperatures need not be as significant.

Thus, as an example, for a flow rate of 0.6 L/min, the resistivity of a DUT is approximately 0.15 C/W/cm² and using the 200 W/cm² power density curve (curve I), the calculated change in temperature is approximately 30 degrees Celsius (C.). Therefore, the change in temperature needed to dissipate 200 W/cm² of DUT power is 30 degrees C. for a flow rate of 0.6 L/min. If the flow rate was increased to approximately 1.0 L/min for the same power density curve, the change in temperature would merely be approximately 20 degrees C. If the flow rate was again increased to approximately 2.0 L/min (for a DUT having a power density of 200 W/cm²), the change in temperature would again be lowered to approximately 12 degrees C. Thus, as the flow rate increases, the required difference in temperature is lowered to dissipate a given amount of heat generated by the DUT.

In view of the conclusions drawn from the collected test data illustrated above, the present invention is directed to a simplified thermal controller system that utilizes fluid at one temperature to maintain a DUT at a constant temperature during testing that minimizes energy loss (associated with fluid mixing), and maximizes cyclical efficiency.

Figure 4:
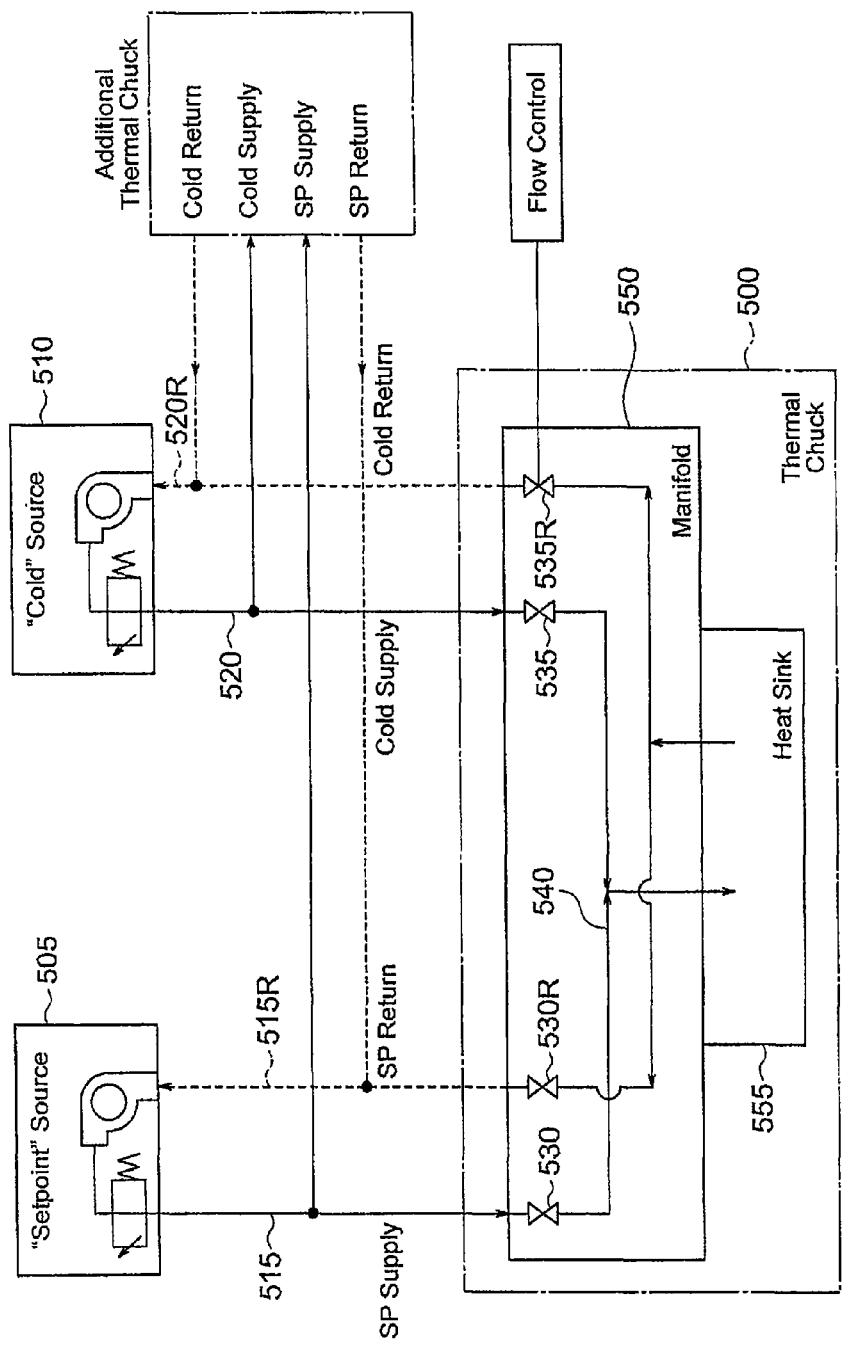
FIG. 4 shows an exemplary side schematic view of a thermal chuck of a thermal controller, according to an embodiment of the present invention.

FIG. 4 shows a schematic view of a thermal chuck 500 in accordance with a non-limiting embodiment of the present invention. This embodiment utilizes two fluid sources (also referred to as reservoirs), namely a set point fluid source 505, and a cold fluid source 510. The fluid in the set point fluid source 505 may be set at the same temperature as the fluid in the cold fluid source 510. Alternatively, the fluid in the cold fluid source may have a temperature less than the temperature of the fluid in the set point fluid source. More specifically, the fluid in the set point fluid source 505 is set at a temperature that is generally the same as a set point (or a target) temperature of a DUT before testing (taking into consideration the thermal loss potentially occurring though the thermal chuck 500). For example, if the set point of the DUT is 80 degrees Celsius, the temperature of the fluid in the set point fluid source 505 may be set at, e.g., 85 degrees Celsius. While the at least two fluid sources 505, 510 may have the same temperatures, it is appreciated by those of skill in the art that the two temperatures may be different, and more or less than two fluid sources may be used in alternative embodiments.

As shown in FIG. 4, supply conduits 515 and 520 operably connect the set point fluid source 505 and the cold fluid source 510, respectively, to the thermal chuck 500. Return conduits 515R and 520R also operably connect the thermal chuck 500 to the two fluid sources 505 and 510, respectively. In this regard, set point fluid from the set point fluid source 505 is directed through supply conduit 515 to the thermal chuck 500. Likewise, cold fluid from the cold fluid source 510 is directed through supply conduit 520 to the thermal chuck 500.

The thermal chuck 500 includes a manifold 550 and a heat sink 555. The manifold includes a plurality of adjustable valves 530, 530R, 535, 535R, 540 for controlling the flow rate of the set point fluid and the cold fluid into and out of the thermal chuck 500. Valve 530 receives set point fluid from supply conduit 515 and directs the set point fluid to valve 540 to be impinged on heat sink 555. Similarly, valve 535 receives cold fluid from supply conduit 520 and directs the cold fluid to valve 540 to be impinged on heat sink 555. After the fluid (i.e., set point or cold) is impinged on heat sink 555, the fluid may be recirculated from the heat sink 555, back to the set point fluid source 505 or the cold fluid source 510, respectively. More specifically, when set point fluid is recirculated, valve 530R receives set point fluid from the heat sink 555 and directs the set point fluid through the return conduit 515R to be stored at the set point fluid source 505. The recirculated set point fluid is then recooled/reheated at the set point fluid source 505 and may be recirculated through the thermal controller system before the start of testing of the DUT. When the cold fluid is recirculated, valve 535R receives the cold fluid from the heat sink 555 and directs the cold fluid through the return conduit 520R to be stored at the cold fluid source 510. The recirculated cold fluid is then recooled/reheated at the cold fluid source 510 and may be recirculated through the thermal controller system for the duration of the testing of the DUT.

Before testing of the DUT, the thermal controller system performs a set point source operation (i.e., soaking). The set point fluid source 505 initiates flow of the set point fluid such that set point fluid exits the set point fluid source 505 through the supply conduit 515 and is directed through the thermal chuck 500 via manifold 550, where the set point fluid also communicates with the valves 530 and 540. The set point fluid then impinges on the heat sink 555 to soak the DUT before testing. The circulation of the set point fluid across the heat sink 555 continues until the DUT achieves the desired set point (or target) temperature for testing. That is, set point fluid may be recirculated through the system. In other words, after the set point fluid has passed through the heat sink 555, it is directed through return valve 530R and through return conduit 515R back to set point fluid source 505 to be reheated/recooled to be sent through the system again. Once the target temperature is reached and the system is ready for testing of the DUT, the set point source operation is shut-off such that set point fluid no longer circulates through the thermal chuck 500 to the heat sink 555. Circulation may be shut-off at the set point fluid source 505, the supply conduit 515, the valve 530, the return valve 530R, the return conduit 515R, at any combination of the above-mentioned features so that the flow of set point fluid ceases to enter the system when testing of the DUT begins, or any other shut-off technique known to those having ordinary skill in the art. It is noted that in this non-limiting embodiment only set point fluid is used to soak the DUT, and if DUT power is relatively small (e.g., 40 W/cm$^2$), only the set point fluid is necessary to dissipate the DUT power during testing of the device. This is called passive control. For example, when power density (PD)=40 W/cm$^2$, and thermal resistivity (R)=0.01 C/(W/cm$^2$), the change in temperature ($\Delta$T)=4° C. In other words, when device power generated during testing is relatively small, the temperature of the device does not fluctuate beyond +/−2° C., and the temperature of the DUT may readily be controlled by only utilizing the set point fluid.

When testing of the DUT begins, the DUT generates heat. During testing the thermal controller system performs a cold source operation and only utilizes the cold fluid source 510. No mixing between the set point fluid source 505 and the cold fluid source 510 occurs during this operation. The cold fluid source 510 initiates the flow of the cold fluid such that the cold fluid exits the cold fluid source 510 through the supply conduit 520 and is directed through the thermal chuck 500 via manifold 550, where the cold fluid also communicates with the valves 535 and 540. The cold fluid then impinges on the heat sink 555 to dissipate heat from the DUT and to maintain the target temperature of the DUT during testing. The circulation of the cold fluid across the heat sink 555 is monitored and adjusted (if appropriate) such that the DUT maintains the set point (or target) temperature for the duration of the testing so as to confirm that certain observed electrical characteristics of the DUT are attributable to factors other than changing temperatures.

As noted above the cold fluid may be recirculated through the system during testing. That is, after the cold fluid has passed through the heat sink 555, it is directed through return valve 535R and through return conduit 520R back to cold fluid source 510 to be reheated/recooled to be sent through the system again. Once testing has ended, the cold fluid source operation is shut-off such that the cold fluid no longer circulates through the thermal chuck 500 to the heat sink 555. Circulation may be shut-off at the cold fluid source 510, the supply conduit 520, the valve 535, the return valve 535R, the return conduit 520R, at any combination of the above-mentioned features so that the flow of cold fluid ceases to enter the system when testing of the DUT ends, or using any other shut-off technique known to those having ordinary skill in the art.

An advantage of utilizing a thermal controller system circulating fluid having one temperature (as opposed to combining fluids having different temperatures) is that less energy is lost when the fluid is directed to be re-heated/re-cooled at the fluid sources for recirculation back into the system. Utilizing only a cold fluid during device testing eliminates the need for multiple heaters and chillers in the system to cool/recool, and heat/reheat fluids to be mixed for use during testing of the DUT. Direct mixing of cold and hot fluids results in significant energy consumption as well as increased chances of thermal gradients across the heat sink 555. Additionally, when the system is not required to mix fluids of different temperatures, no energy is lost through the combining of the fluids. Less energy loss through the thermal controller system results in the system working less to achieve the same desired result (i.e., maintaining the DUT at a target temperature during the testing). It is further noted that the less energy is wasted during mixing, the higher the efficiency (i.e., less work) of the chillers/heaters to re-cool/re-heat the fluid back to the set point temperature or the cold temperature. Thus, utilization of only a single fluid (i.e., utilizing only the cold fluid, and eliminating the direct mixing of cold and hot fluid) during testing of a DUT increases energy efficiency, reduces power consumption of the system, and eliminates unnecessary equipment.

Figure 5:
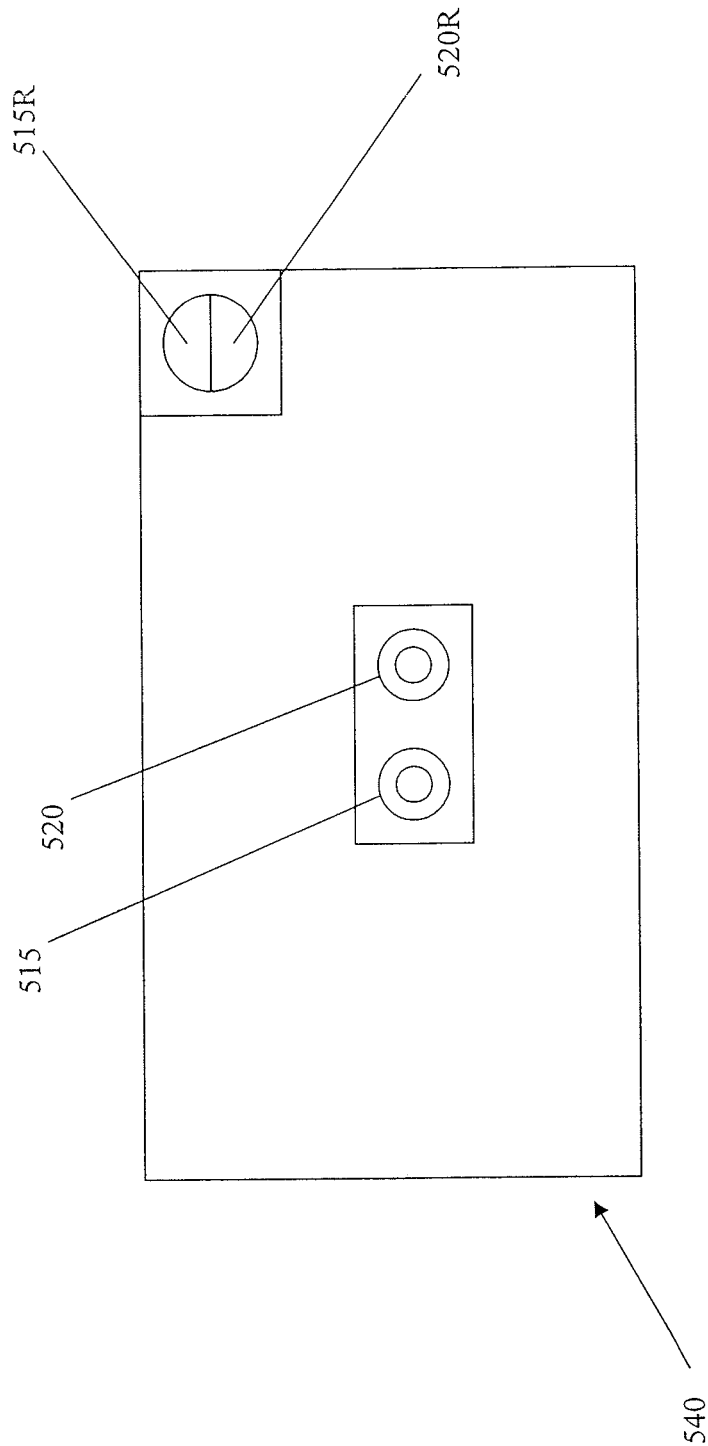
FIG. 5 shows an exemplary schematic bottom plan view of a valve of a thermal controller, according to the embodiment of the present invention.

FIG. 5 schematically shows a bottom plan view of the adjustable valve 540 in communication with supply conduit 515 and 520. The adjustable valve 540 is preferably mounted immediately above the heat sink, and is actuated to discharge a desired flow rate of fluid such that the fluid may impinge upon the heat sink 555 (shown in FIG. 4). Specifically, in a non-limiting embodiment, the adjustable valve 540 may be controlled to discharge either the set point fluid or the cold fluid; the valve may also be controlled to aid in recirculating the fluid that has already impinged upon the heat sink 555, and directs the fluid via return conduits 515R, 520R (shown in FIG. 5) back to the fluid sources 505 and 510, respectively. Those of skill in the art would readily appreciate that the adjustable valves 530, 530R, 535, 535R and 540 may take any suitable form of input to accomplish the function of varying the flow rate of fluid (by dropping, maintaining or increasing pressure, depending on the need), including but not limited to disc valves, gate valves, plug valves, globe valves, check valves, butterfly valves, diaphragm & ball valves, needle valves, pinch valves and the like. Also, one or more suitable number of valves may be used to vary the fluid flow rate.

FIG. 4 shows that impinged fluid from return conduits 515R and 520R is returned to the set point fluid source 505 and the cold fluid source 510, respectively. However, those of skill in the art would appreciate that in alternative embodiments, only one fluid return conduit or multiple fluid return conduits may be supplied from the thermal chuck back to one or more fluid sources. Additionally, the aforementioned combined fluid return could be performed either internally or externally to the thermal chuck 500.

Although the set point fluid source 505 and cold fluid source 510 may preferably circulate fluid at adjustable variable rates, it is understood by those skilled in the art that other suitable different fluid circulation rates may be employed, and the circulated rate may be constant instead of varied. The variable flow rates may be determined by, but not limited to, a detected temperature of the DUT, a detected temperature of the heat sink, a detected power density of the DUT, and a detected resistivity of the heat sink. Further, the conduits 515, 515R, 520 and 520R are adjustable, for example, so that a portion of the fluid entering the supply conduits 515 and 520 correspond to the portion of fluid exiting at return conduits 515R and 520R.

Figure 6:
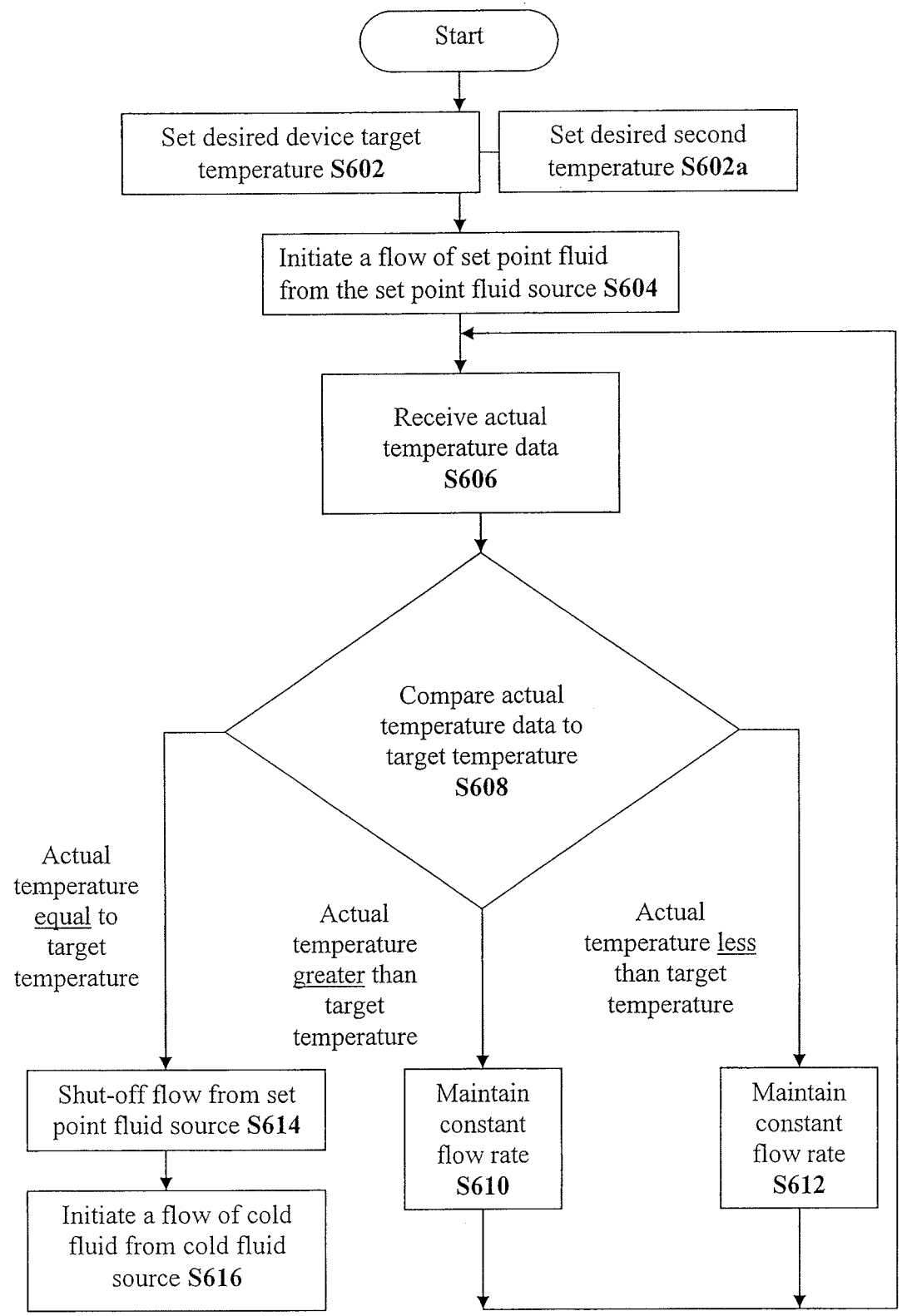
FIG. 6 shows a flowchart of an exemplary method for controlling the temperature of an electronic device, according to an aspect of the present invention.
Figure 7:
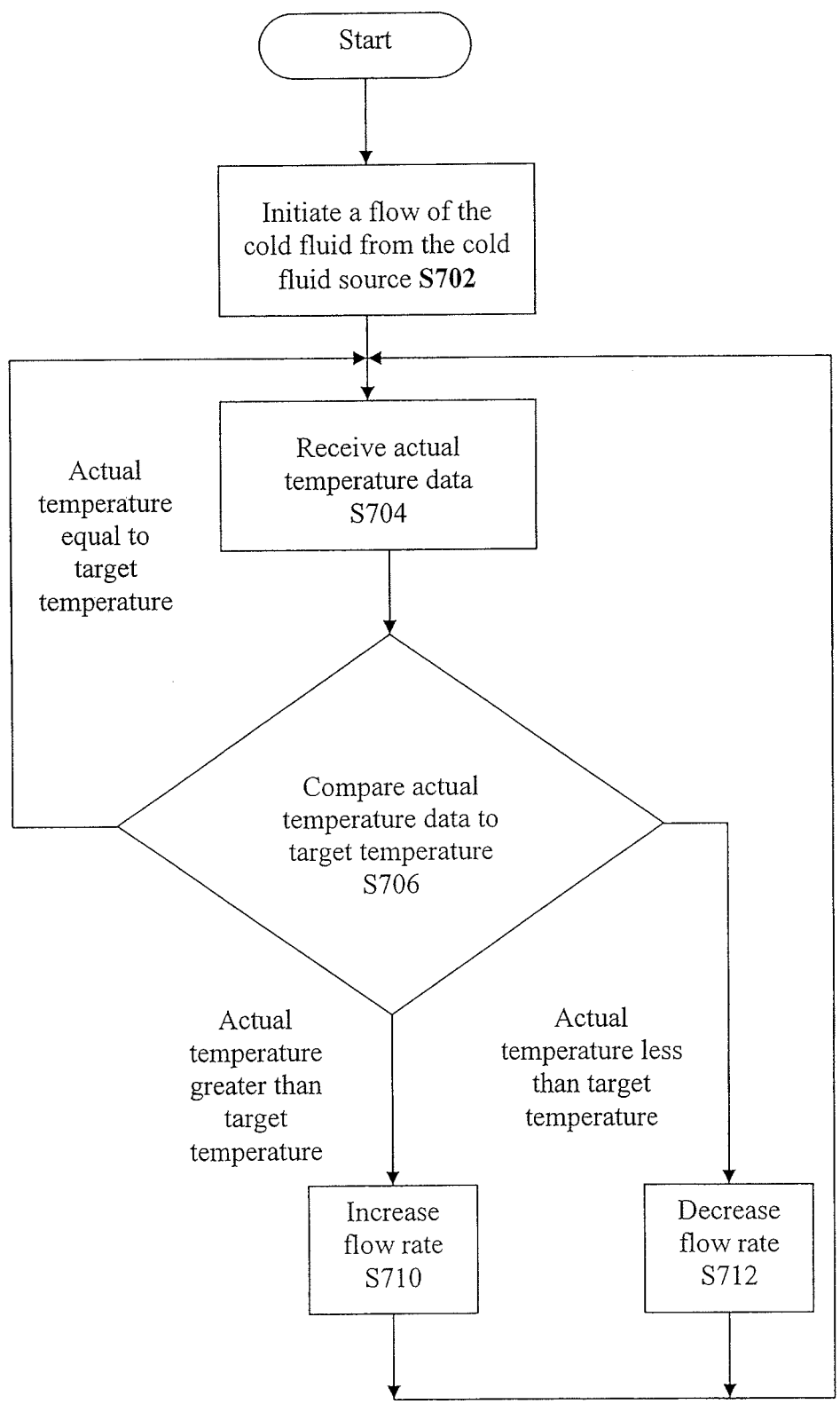
FIG. 7 shows a flowchart of an exemplary method for controlling the temperature of an electronic device, according to another aspect of the present invention.

FIGS. 6 and 7 show flow charts of an exemplary method for controlling the temperature of an electronic device, according to various aspects of the present invention. In step S602, a desired or target temperature of the DUT is set for the thermal controller system to maintain the DUT at during testing. The target temperature may be a set point temperature at which a DUT is to be tested (e.g., 90 degrees Celsius). Alternatively, the target temperature may be a desirable temperature (or temperature range) at which an electronic component is to function in an operational environment.

Before the start of a test, a set point temperature is determined for the set point fluid source, and a cold temperature may be determined for the cold fluid source (S602, 602a). The device is soaked to the set point temperature preferably only using the set point fluid, although those skilled in the art would appreciate that the cold source may also be used in the soaking process. At step S604 the flow of the set point fluid (from the set point fluid source) is initiated to release the set point fluid to the thermal chuck 500. At step S606 the actual temperature of the electronic device (e.g., the DUT) and/or of the heat sink in contact with the electronic device is measured (i.e., temperature data). The measured temperature is then compared to the desired temperature (i.e., target/set point temperature) in step S608. When the two temperatures are the same, no adjustment is made to the fluid flow rate through the heat sink, and the operation is shut-off at step S614. Once the set point fluid source operation is shut-off, the cold fluid source operation may be initiated at step S616.

When the temperature of the device and/or heat sink changes, the valves 530 and 540 maintain the flow of the set point fluid at a constant flow rate until the desired temperature is reached. Regardless of whether the temperature data is less or greater than the target temperature, the set point fluid flowing through the heat sink is maintained at the constant flow rate (S610, S612) until the DUT temperature equals the set point temperature and ready for the testing operation at step S616. If the actual temperature measured is not equal to the target temperature then the process returns to step S606 to receive updated temperature data, and the subsequent steps are repeated as necessary. However, those having ordinary skill in the art will appreciate that when the temperature of the device and/or heat sink changes, the valves 530 and 540 may adjust the flow rate accordingly. That is, when the temperature data is less than the target temperature, the amount of fluid flowing through the heat sink is increased by the valves 530 and 540 at step S612, thus increasing the heat sink temperature. When the temperature data is greater than the target temperature, the amount of fluid flowing through the heat sink is decreased by the valves 530 and 540 at step S610, thus reducing the heat sink temperature and the DUT temperature. In either case, after the flow adjustments are made, the process returns to step S606 to receive updated temperature data, and the subsequent steps are repeated as necessary until the DUT is soaked to the set point temperature and ready for the testing operation at step S616.

Once the actual temperature data is equal to the target temperature, the set point fluid source ceases operation and is shut-off, the flow of the cold fluid (from the cold fluid source) is initiated at step S616, and the actual temperature data and target temperature continue to be monitored for the duration of the testing. At step S702 the flow of the cold fluid is initiated and the cold fluid is released to the thermal chuck 500. At step S704 the actual temperature of the electronic device (e.g., the DUT) and/or of the heat sink in contact with the electronic device is measured (i.e., temperature data). The measured temperature is then compared to the desired temperature (i.e., target temperature) in step S706. When the two temperatures are the same, no adjustment is made to the fluid flow rate through the heat sink, and the process returns to step S704 to receive updated temperature data.

When the temperature of the device and/or heat sink changes, the valves 535 and 540 adjust the flow rate accordingly. It is noted that either one of the valves, or both of the valves may be used in adjusting the flow rate of the set point fluid. When the temperature data is less than the target temperature, the amount of fluid flowing through the heat sink is decreased by the valves 535 and 540 at step 712, thus increasing the heat sink temperature. When the temperature data is greater than the target temperature, the amount of fluid flowing through the heat sink is increased by the valves 535 and 540 at step S710, thus reducing the heat sink temperature. In either case, after the flow adjustments are made, the cold source operation returns to step S704 to receive updated temperature data, and the subsequent steps are repeated as necessary until the end of the testing operation.

Figure 8:
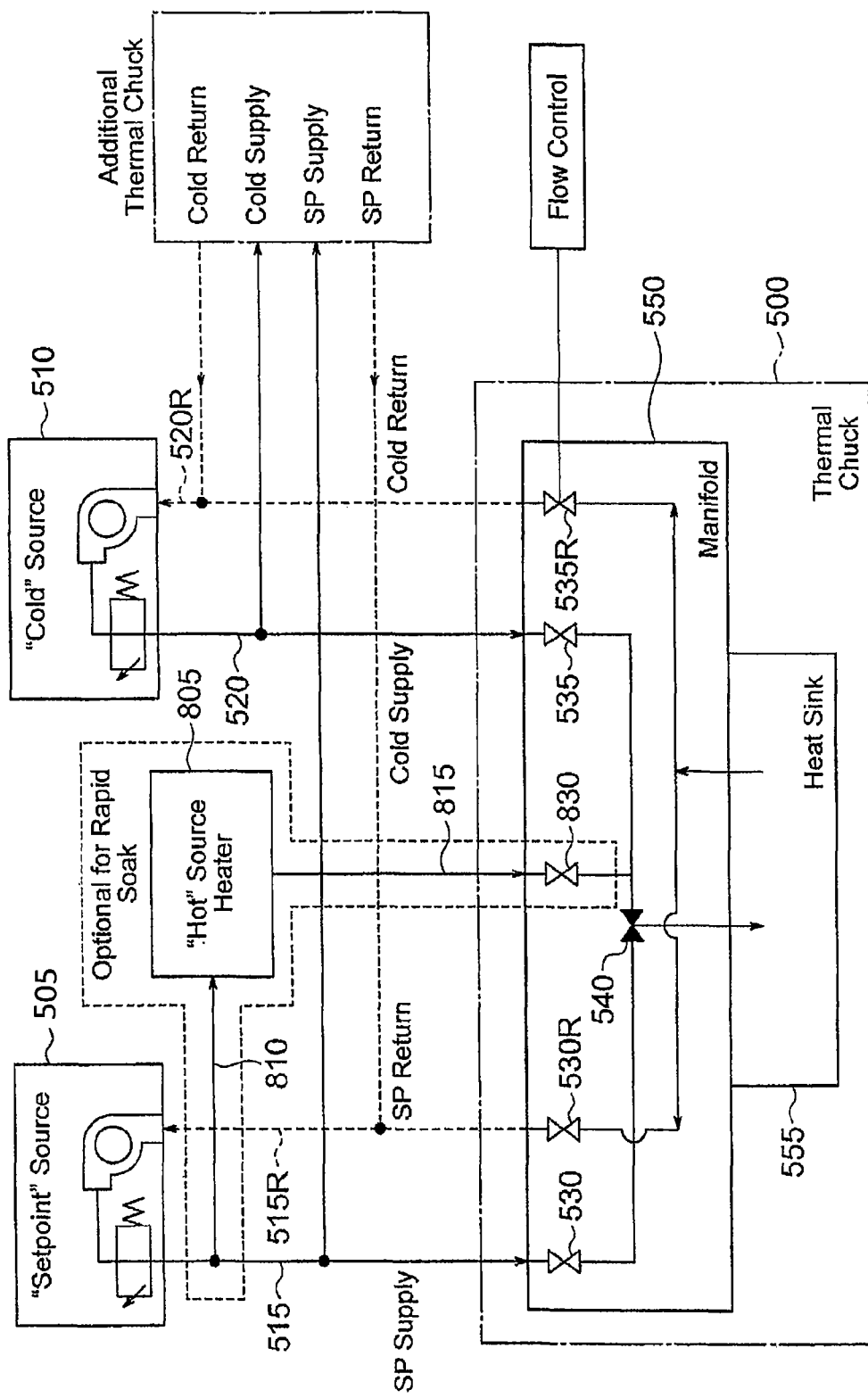
FIG. 8 shows an exemplary side schematic view of a thermal chuck of a thermal controller, according to a second embodiment of the present invention.

In another non-limiting embodiment, the thermal controller system may perform a rapid soak operation before the testing of the DUT to more quickly achieve the testing target temperature (i.e., set point temperature). In this embodiment, the thermal controller system may include the features as described above in the description of FIG. 4, but also includes additional features to facilitate the rapid soak operation of the DUT. More particularly, the thermal controller system of FIG. 8 includes a hot fluid source 805 having an external heater for heating fluid to be discharged through the heat sink 555. In this regard, the hot fluid source 805 receives the set point fluid from the set point fluid source 505 through a bypass conduit 810 extending from the supply conduit 515. The hot fluid source 805 is also connected with the thermal chuck 500 through a third supply conduit 815.

The hot fluid source 805 heats the set point fluid into a hot fluid having a hot temperature that is higher than the set point fluid and the cold fluid. The third supply conduit 815 directs the hot fluid to a hot adjustable valve 830 that controls the flow of the hot fluid to be circulated through (e.g., impinged on) the heat sink 555. After the hot fluid is impinged on heat sink 555, the hot fluid may be recirculated from the heat sink 555, back to the set point fluid source 505. More specifically, when the hot fluid is recirculated, valve 530R receives the hot fluid from the heat sink 555 and directs the hot fluid through the return conduit 515R to be stored at the set point source 505. The recirculated hot fluid is then recooled/reheated at the set point source 505 and may be recirculated through the thermal controller system before the start of testing of the DUT. Once the target temperature of the DUT is reached and the system is ready for testing of the DUT, the rapid soak operation is shut-off such that the hot fluid no longer circulates through the thermal chuck 500 to the heat sink 555. Circulation may be shut-off at the set point source 505, the conduit 515, the bypass conduit 810, the third supply conduit 815, the return valve 530R, the return conduit 515R, at any combination of the above-mentioned features so that the flow of the hot fluid ceases to enter the system when testing of the DUT begins, or using any other shut-off technique known to those having ordinary skill in the art.

Figure 9:
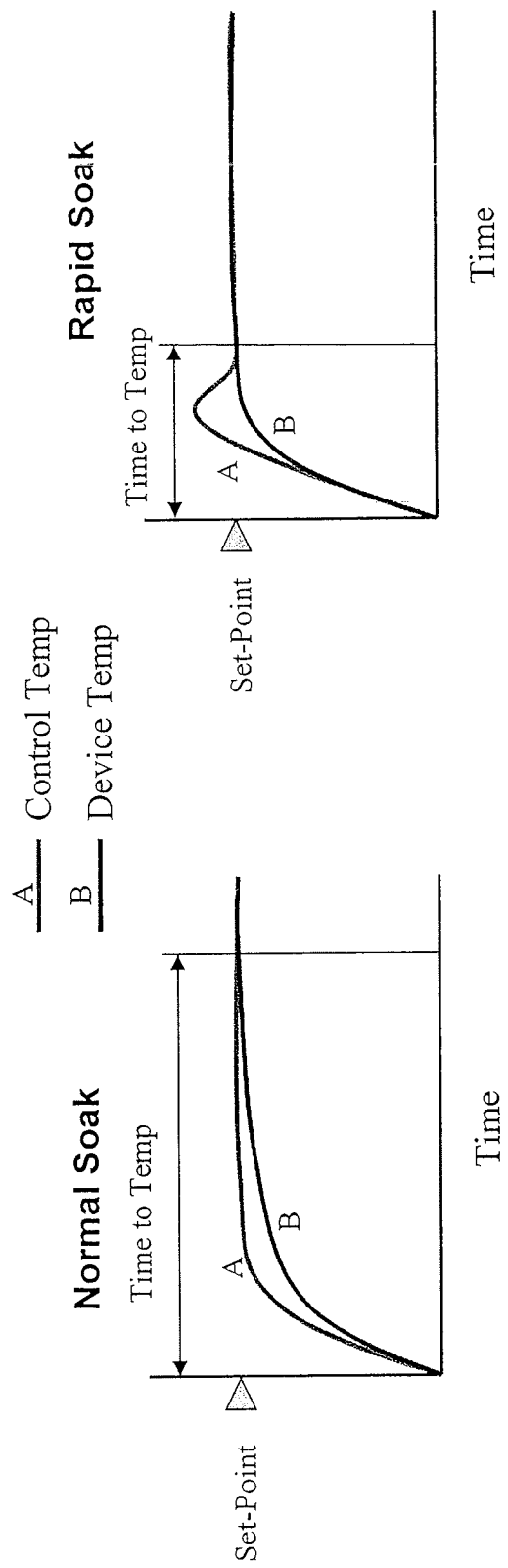
FIG. 9 shows two graphs of soaking procedures of a non-limiting feature of the invention before a test of the device depicting the relationship between time to achieve a target temperature for testing of an electronic device and control temperatures of fluids used to reach the target temperature.

As shown in FIG. 9, two graphs are presented. The first depicts a normal soak procedure before a testing of the DUT as described in the first non-limiting embodiment. The second depicts a rapid soak procedure before a testing of the DUT. In both graphs, the y-axis represents temperature, and the x-axis represents time. In both procedures the device begins at a room temperature (e.g., 23 degrees Celsius) at a time zero. When the normal soak procedure begins, a fluid having a control temperature is heated up to a set point temperature (e.g., 90 degrees Celsius) and flows at a constant rate through the heat sink 555 until the device temperature reaches a target temperature (i.e., the set point temperature) that is desirable for the testing of the DUT. In comparison, during the rapid soak procedure, the fluid having the control temperature heats up to a peak temperature (e.g., 120 degrees Celsius) in a short amount of time (as indicated by the steep curve A). The fluid then either adjusts its flow rate or is shut-off such that the device temperature achieves and maintains the target temperature (i.e., the set point temperature) for testing of the DUT. Heating the fluid to the peak temperature allows the device to achieve the desired temperature for testing more quickly than when utilizing the normal soak procedure.

The rapid soak procedure is also known as system overdrive. In system overdrive, the control temperature fluid is heated above the desired temperature of the device to heat the device to the desired temperature. However, caution must be taken when performing system overdrive because if the device temperature exceeds the desired temperature for testing, then a system overshoot may occur, and the device and/or equipment may be damaged and may result in altered results from the testing period.

Figure 10:
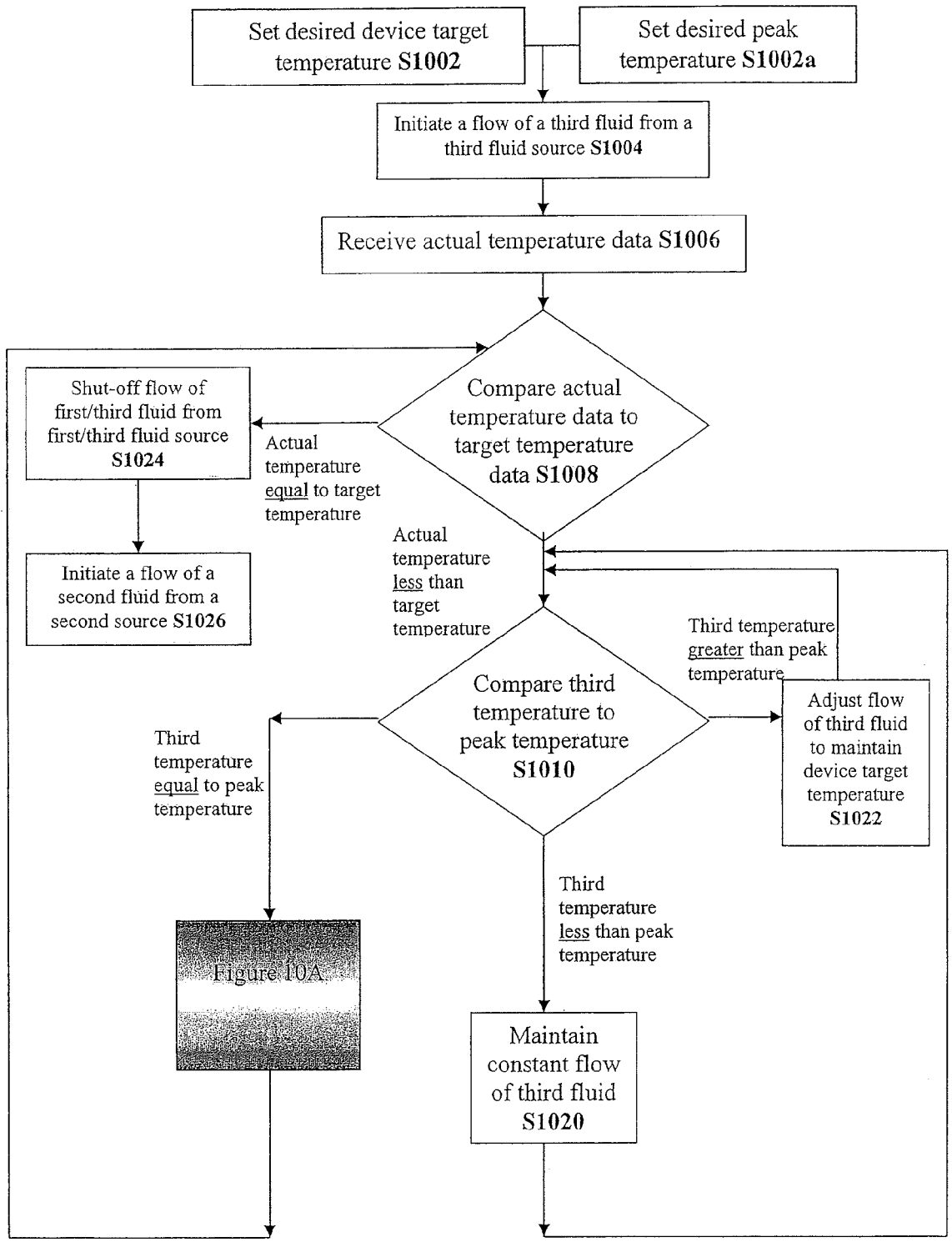
FIG. 10 and FIG. 10A show a flowchart of an exemplary method for controlling the temperature of an electronic device, according to yet another aspect of the present invention
Figure 10A:
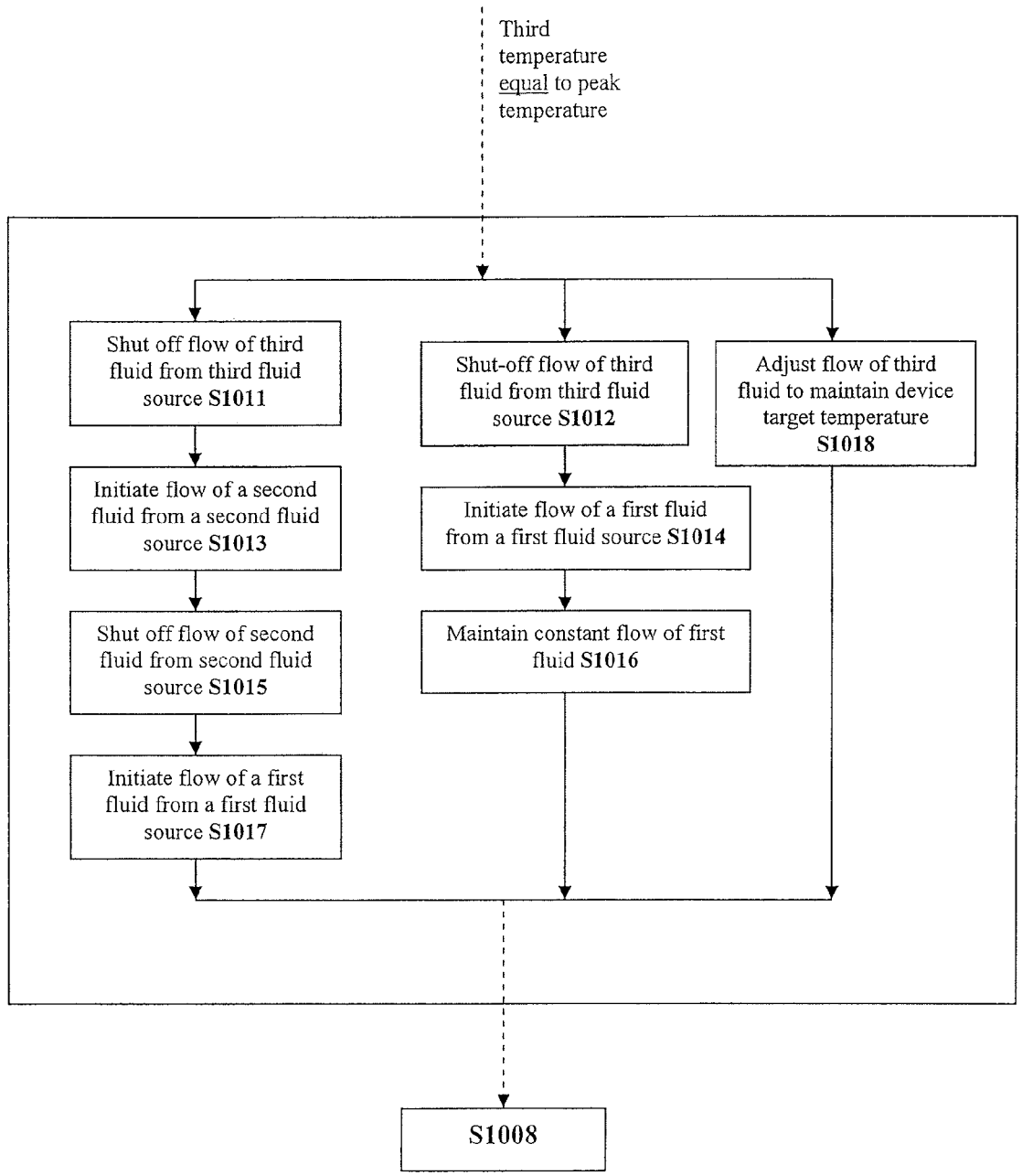

In this regard, FIG. 10 and FIG. 10A show a flow chart of a method for controlling the temperature of an electronic device before a test using the rapid soak procedure. In step S1002, a desired or target temperature to maintain the DUT is set. The target temperature may be a set point temperature at which a DUT is to be tested (e.g., 90 degrees Celsius). Alternatively, the target temperature may be a desirable temperature (or temperature range) at which an electronic component is to function in an operational environment.

Before the start of a test, the set point temperature is determined for the set point fluid source, and a peak temperature is determined for a hot fluid in a hot fluid source (S1002a). The method includes initiating a flow of the set point fluid from the set point fluid source, and directing the set point fluid to the hot fluid source 805 through bypass conduit 810. The set point fluid is then heated into the hot fluid (i.e., third fluid) having a hot temperature.

At step S1004, the hot fluid is circulated through the heat sink at a constant flow rate. At step S1006 the actual temperature of the electronic device (e.g., the DUT) and/or of the heat sink in contact with the electronic device is measured (i.e., temperature data). The measured temperature is then compared to the desired temperature (i.e., target/set point temperature) in step S1008. When the two temperatures are the same, no adjustment is made to the fluid flow rate through the heat sink, and the hot fluid source and rapid soak procedure are shut-off at step S1024. Once the rapid soak procedure is shut-off, the cold fluid source operation (as described above) may be initiated at step S1026.

However, when the actual/measured temperature data is less than the target/set point temperature, the hot temperature is compared to the peak temperature set in step S1002a. When the hot temperature is equal to the peak temperature, depending on the system configuration, three options are available. It is noted that these options operate independently of each other, and not together. In a first instance, in step S1012, when the hot fluid reaches the peak temperature, the hot fluid source 805 having the hot fluid is shut-off Once the hot fluid source 805 is shut-off, the set point fluid source 505 is operable and initiates the flow of the set point fluid (at step S1014) at the constant flow rate to flow through supply conduit 515 to the heat sink 555 to maintain the device at the target temperature until the start of the test (at step S1016). Alternatively, in a second instance, in step S1018, the hot fluid source 805 continues to direct the hot fluid through the heat sink 555. More particularly, at least the valve 830 adjusts the flow rate of the hot fluid such that the device is maintained at the target temperature until the start of the test. In the second instance, the flow rate adjustment of the hot fluid is similar to the cold source operation described above in that when the flow rate of the hot fluid decreases, the resistivity of the heat sink increases. However, when the flow rate of the hot fluid increases, the temperature of the device and temperature of the heat sink also increases.

In a third instance, in step S1011, when the peak temperature (e.g., 120 degree Celsius) is reached, the hot fluid source 805 having the hot fluid is shut-off Once the hot fluid source 805 is shut-off, the cold fluid source 510 is operable and initiates the flow of the cold fluid at the constant flow rate to flow through supply conduit 520 to the heat sink 555 (at step S1013). After a short time, the set point temperature (e.g., 90 degree Celsius) is reached, then, the cold fluid source 510 having the cold fluid is shut-off (at step S1015). Once the cold fluid source 510 is shut-off, the set point fluid source 505 is operable and initiates the flow of the set point fluid at the constant flow rate (at step S1017) to flow through supply conduit 515 to the heat sink 555 to maintain the device at the target temperature until the start of the test (at step S i 026). Alternatively, in the third instance, in step S1015, a temperature (e.g., 100 degree Celsius) less than the peak temperature and greater than the set point temperature is reached, then, the cold fluid source 510 having the cold fluid may be shut-off and the set point fluid source 505 may be operable and may initiate the flow of the set point fluid at the constant flow rate (at step S1017) to flow through supply conduit 515 to the heat sink 555 to maintain the device at the target temperature until the start of the test (at step S1026).

When the hot temperature is less than the peak temperature, the valve 830 maintains the constant flow rate of the hot fluid through the heat sink 555 until the hot temperature reaches the peak temperature (see steps S1010, S1012, S1018). In the event that the hot temperature is greater than the peak temperature (and the target temperature of the device has not been exceeded), the flow rate of the hot fluid may be adjusted in step S1022 (similarly to the steps recited in step S1018) such that the device is maintained at the target temperature until the start of the test.

As stated above, the disclosed embodiments create more energy dissipation from the DUT, less energy loss from the system, and faster response times to control and maintain the target temperature of the DUT. Thus, one result is that the disclosed embodiments enable more rigorous testing of electronic devices, handling tests beyond the effective 500 Watt limit of conventional devices, e.g., up to 1500 Watts. Further, thermal control of electronic devices in any environment (testing and/or operational) is greatly enhanced.

Although the invention has been described with reference to several exemplary embodiments, which can be combined in any suitable manner, it is understood that the words that have been used are words of description and illustration, rather than words of limitation. Changes may be made within the purview of the appended claims, as presently stated and as amended, without departing from the scope and spirit of the invention in its aspects. Although the invention has been described with reference to particular means, materials and embodiments, the invention is not intended to be limited to the particulars disclosed. Rather, the invention extends to all functionally equivalent structures, methods and uses such as are within the scope of the appended claims.

What is claimed:

1. An apparatus for controlling a temperature of a device by circulating fluid through a heat sink in thermal contact with the device, the apparatus comprising:
    a first fluid source including a first fluid controllable by a controller to reach a first temperature which is a target temperature of the device;
    a second fluid source including a second fluid controllable by the controller to reach a second temperature lower than the first temperature;
    a third fluid source including a third fluid controllable by the controller to reach a third temperature range higher than the first and second temperature; and
    a thermal chuck operably connected to the first fluid source via a first supply conduit, the second fluid source via a second supply conduit, and the third fluid source via a third supply conduit;
    a first return conduit configured to return a fluid flowing from the thermal chuck to the first fluid source;
    a second return conduit, different from the first return conduit, configured to return a fluid flowing from the thermal chuck to the second fluid source, wherein:
    the thermal chuck includes at least one valve controllable by the controller and configured such that, when the at least one valve is opened by the controller, a flow rate of the first fluid circulating through the heat sink is constant, the at least one valve further configured to variably control a flow rate of the second fluid and a flow rate of the third fluid circulating through the heat sink,
    the first supply conduit includes a bypass conduit extending from the first fluid source and terminating at the third fluid source,
    the first fluid source and the third fluid source are in a shut-off state and the second fluid is operable when a temperature of the fluid flowing through the heat sink is equal to the target temperature of the device,
    a temperature of the third fluid is compared by the controller to the third temperature range when the temperature of the fluid flowing through the heat sink is less than the target temperature of the device,
    when the temperature of the third fluid is equal to a temperature within the third temperature range, the controller shuts off the third fluid source and controls the second fluid source to be operable, then the controller shuts off the second fluid source and controls the first fluid source to be operable,
    when the temperature of the third fluid is lower than a temperature within the third temperature range, the flow rate of the third fluid circulating though the heat sink is maintained by the controller, and
    when the temperature of the third fluid is higher than a temperature within the third temperature range, the flow rate of the third fluid circulating though the heat sink is adjusted by the controller.

2. An apparatus for controlling a temperature of a device by circulating fluid through a heat sink in thermal contact with the device, the apparatus comprising:
    a first fluid source including a first fluid controllable by a controller to reach a first temperature which is a target temperature of the device;
    a second fluid source including a second fluid controllable by the controller to reach a second temperature lower than the first temperature;
    a third fluid source including a third fluid controllable by the controller to reach a third temperature range higher than the first and second temperature; and
    a thermal chuck operably connected to the first fluid source via a first supply conduit, the second fluid source via a second supply conduit, and the third fluid source via a third supply conduit;
    a first return conduit configured to return a fluid flowing from the thermal chuck to the first fluid source;
    a second return conduit, different from the first return conduit, configured to return a fluid flowing from the thermal chuck to the second fluid source, wherein:
    the thermal chuck includes at least one valve controllable by the controller and configured such that, when the at least one valve is opened by the controller, a flow rate of the first fluid circulating through the heat sink is constant, the at least one valve further configured to variably control a flow rate of the second fluid and a flow rate of the third fluid circulating through the heat sink,
    the first supply conduit includes a bypass conduit extending from the first fluid source and terminating at the third fluid source,
    the first fluid source and the third fluid source are in a shut-off state and the second fluid is operable when a temperature of the fluid flowing through the heat sink is equal to the target temperature of the device,
    a temperature of the third fluid is compared by the controller to the third temperature range when the temperature of the fluid flowing through the heat sink is less than the target temperature of the device,
    when the temperature of the third fluid is equal to a temperature within the third temperature range, the controller shuts off the third fluid source and controls the first fluid source to be operable, then the controller maintains the flow rate of the first circulating though the heat sink, when the temperature of the third fluid is lower than a temperature within the third temperature range, the flow rate of the third fluid circulating though the heat sink is maintained by the controller, and when the temperature of the third fluid is higher than a temperature within the third temperature range, the flow rate of the third fluid circulating though the heat sink is adjusted by the controller.

3. An apparatus for controlling a temperature of a device by circulating fluid through a heat sink in thermal contact with the device, the apparatus comprising:

a first fluid source including a first fluid controllable by a controller to reach a first temperature which is a target temperature of the device;

a second fluid source including a second fluid controllable by the controller to reach a second temperature lower than the first temperature;

a third fluid source including a third fluid controllable by the controller to reach a third temperature range higher than the first and second temperature; and a thermal chuck operably connected to the first fluid source via a first supply conduit, the second fluid source via a second supply conduit, and the third fluid source via a third supply conduit;

a first return conduit configured to return a fluid flowing from the thermal chuck to the first fluid source;

a second return conduit, different from the first return conduit, configured to return a fluid flowing from the thermal chuck to the second fluid source, wherein:

the thermal chuck includes at least one valve controllable by the controller and configured such that, when the at least one valve is opened by the controller, a flow rate of the first fluid circulating through the heat sink is constant, the at least one valve further configured to variably control a flow rate of the second fluid and a flow rate of the third fluid circulating through the heat sink, the first supply conduit includes a bypass conduit extending from the first fluid source and terminating at the third fluid source, the first fluid source and the third fluid source are in a shut-off state and the second fluid is operable when a temperature of the fluid flowing through the heat sink is equal to the target temperature of the device, a temperature of the third fluid is compared by the controller to the third temperature range the temperature of the fluid flowing through the heat sink is less than the target temperature of the device, when the temperature of the third fluid is equal a temperature within the third temperature range, the controller adjusts the flow rate of the third fluid circulating though the heat sink, when the temperature of the third fluid is lower than a temperature within the third temperature range, the flow rate of the third fluid circulating though the heat sink is maintained by the controller, and when the temperature of the third fluid is higher than a temperature within the third temperature range, the flow rate of the third fluid circulating though the heat sink is adjusted by the controller.

* * * * *

UNITED STATES PATENT AND TRADEMARK OFFICE
CERTIFICATE OF CORRECTION

PATENT NO. : 8,844,612 B2
APPLICATION NO. : 12/445669
DATED : September 30, 2014
INVENTOR(S) : T. Tani et al.

Page 1 of 1

It is certified that error appears in the above-identified patent and that said Letters Patent is hereby corrected as shown below:

In the Claims

Column 16, line 20 (claim 1) "though" should be -- through -- after circulating.

Column 16, line 24 (claim 1) "though" should be -- through -- after circulating.

Column 17, line 2 (claim 2) "though" should be -- through -- after circulating.

Column 17, line 5 (claim 2) "though" should be -- through -- after circulating.

Column 17, line 9 (claim 2) "though" should be -- through -- after circulating.

Column 18, line 21 (claim 3) "though" should be -- through -- after circulating.

Column 18, line 25 (claim 3) "though" should be -- through -- after circulating.

Column 18, line 29 (claim 3) "though" should be -- through -- after circulating.

Signed and Sealed this
Seventeenth Day of February, 2015

Michelle K. Lee
*Deputy Director of the United States Patent and Trademark Office*